United States Patent
Okuno et al.

(10) Patent No.: US 7,982,640 B2
(45) Date of Patent: Jul. 19, 2011

(54) DIGITAL SIGNAL TRANSMITTING APPARATUS AND DIGITAL SIGNAL TRANSMITTING METHOD

(75) Inventors: Reiji Okuno, Tokyo (JP); Takakazu Imai, Tokyo (JP); Takeo Gokita, Tokyo (JP)

(73) Assignee: TDK Corporation, Tokyo (JP)

( * ) Notice: Subject to any disclaimer, the term of this patent is extended or adjusted under 35 U.S.C. 154(b) by 112 days.

(21) Appl. No.: 12/588,004

(22) Filed: Sep. 30, 2009

(65) Prior Publication Data

US 2010/0079316 A1    Apr. 1, 2010

(30) Foreign Application Priority Data

Sep. 30, 2008  (JP) ................................ 2008-255051
Sep. 29, 2009  (JP) ................................ 2009-224998

(51) Int. Cl.
*H03M 9/00*    (2006.01)

(52) U.S. Cl. ......................... 341/101; 341/100; 341/152

(58) Field of Classification Search .......... 341/100–101, 341/152
See application file for complete search history.

(56) References Cited

U.S. PATENT DOCUMENTS

| | | | | |
|---|---|---|---|---|
| 5,148,168 | A * | 9/1992 | Masuda et al. ................ | 341/152 |
| 6,335,696 | B1 * | 1/2002 | Aoyagi et al. ................ | 341/100 |

FOREIGN PATENT DOCUMENTS

JP    B2 3344530    11/2002

* cited by examiner

*Primary Examiner* — Khai M Nguyen
(74) *Attorney, Agent, or Firm* — Oliff & Berridge, PLC

(57) ABSTRACT

A digital signal transmitting apparatus includes an encoder which converts parallel input signals of multiple channels into serial data in a manner synchronized with a first clock signal, and a decoder which converts the serial data into parallel output signals of the multiple channels in a manner synchronized with a second clock signal operating in a manner asynchronous with the first clock signal. The serial data has a different period and a different duty factor corresponding to each combination of the logical values of the parallel input signals of the multiple channels.

4 Claims, 5 Drawing Sheets

| CH1_IN | CH2_IN | SERIAL DATA | DUTY FACTOR | PERIOD |
|---|---|---|---|---|
| 0 | 0 | D1 | 1:1 | 2T/(1+N) |
| 1 | 0 | D2 | 1:N | T |
| 0 | 1 | D3 | N:1 | T |
| 1 | 1 | D1 | 1:1 | 2T/(1+N) |

| DETERMINATION CONDITION | CH1_OUT | CH2_OUT |
|---|---|---|
| UC<P AND LC<P | 0 | 0 |
| UC<P AND LC≧P | 1 | 0 |
| UC≧P AND LC<P | 0 | 1 |
| UC≧P AND LC≧P | 0 | 0 |

| CH1_IN | CH2_IN | SERIAL DATA | DUTY FACTOR |
|--------|--------|-------------|-------------|
| 0 | 0 | D1 | A:X |
| 1 | 0 | D2 | B:Y |
| 0 | 1 | D3 | Z:C |
| 1 | 1 | D1 | A:X |

DIGITAL SIGNAL TRANSMITTING APPARATUS AND DIGITAL SIGNAL TRANSMITTING METHOD

BACKGROUND OF THE INVENTION

1. Field of the Invention

The present invention relates to a digital signal transmitting apparatus and digital signal transmitting method for performing asynchronous transmission of a digital signal.

2. Description of the Related Art

Japanese Patent No. 3344530 has disclosed a digital signal transmitting apparatus including: a modulator which modulates a data clock and digital signals of multiple channels synchronized with the data clock and thereby produces a transmit digital signal; a single transmission line used to transmit the transmit digital signal; and a demodulator which demodulates the modulated transmit digital signal to produce the data clock and the digital signals of the multiple channels. The demodulator includes a PLL circuit which synchronizes the data clock with the transmit digital signal. In the digital signal transmitting apparatus described in the Patent Document, the duty factor (pulse width) of the transmit digital signal is varied according to a combination of the binary levels of digital signals of multiple channels, thereby allowing data discrimination.

However, the above described digital signal transmitting apparatus requires a PLL circuit, so the circuit size increases; further, since it takes a lock time for the PLL circuit at the time of startup, the start-up time is prolonged. Meanwhile, there is a system which does not use a PLL circuit and is provided with independent clocks in the modulator and demodulator so that asynchronous transmission of digital signals is performed. In this case, a difference of a predetermined value or more between the clock of the modulator and the clock of the demodulator causes erroneous transmission, so considerations must be given to prevent the erroneous transmission.

Thus an object of the present invention is to provide a digital signal transmitting apparatus and digital signal transmitting method of an asynchronous type capable of suppressing erroneous transmission caused by such clock variation.

SUMMARY OF THE INVENTION

In order to address the above problem, a digital signal transmitting apparatus according to the present invention includes: an encoder which converts parallel input signals of multiple channels into serial data in a manner synchronized with a first clock signal; and a decoder which converts the serial data into parallel output signals of the multiple channels in a manner synchronized with a second clock signal operating in a manner asynchronous with the first clock signal. Here, the serial data has a different period and a different duty factor corresponding to each combination of the logical values of the parallel input signals of the multiple channels; the number of times of the logical value of the serial data shifting from a high level to a low level or shifting from a low level to a high level in a length of time of one period at the serial data is one; and the decoder includes: a counter which counts whether the logical value of the serial data is a high level or a low level at a point in time when the second clock signal rises or falls; and a discriminator which converts the serial data into the parallel output signals of the multiple channels based on the count result of the counter corresponding to one period or multiple periods of the serial data.

In view of the fact that the number of times of the logical value of the serial data shifting from a high level to a low level or shifting from a low level to a high level in a length of time of one period of the serial data is one, and of the fact that the period of the second clock signal is constant, the count result of the counter should be used as information indicating a length of time in which the logical value of the serial data is a high level or a length of time in which the logical value of the serial data is a low level. This information can be used as a determination condition for the discriminator converting the serial data into the parallel output signals of the multiple channels.

The serial data has a different period and a different duty factor corresponding to each combination of the logical values of the parallel input signals of the multiple channels; thus the decoder determines a period and duty of the serial data, whereby the serial data can be converted into the parallel output signals of the multiple channels based an the determination result. More specifically, the decoder counts whether the logical value of the serial data is a high level or a low level at a point in time when the second clock signal rises or falls, and determines a period and duty factor of the serial data based on the count result.

In this way, the serial data has a different period and a different duty factor corresponding to each combination of the logical values of the parallel input signals of the multiple channels, so even when a variation occurs in the first clock signal or the second clock signal, a digital signal transmitting apparatus with a large transmission margin can be implemented.

Preferably, after the serial data starts being outputted, the counter resets the number of counts to zero at a point in time when the second clock signal first rises or falls. When performed in this way, the number of bits required for counting a high-level length of time or a low-level length of time in a period determined based on a point in time when the second clock signal rises or a point in time when the second clock signal falls, is sufficient for the number of bits required in the counter. Thus, while limiting the number of bits required in the counter to a smaller number, the signal transmission is implemented.

According to a preferred embodiment of the present invention, when the serial data is expressed as D1, D2 and D3, and the high-level lengths of time of D1, D2 and D3 are $T_A$, $T_B$ and $T_Z$, respectively, and the low-level lengths of time of D1, D2 and D3 are $T_X$, $T_Y$ and $T_C$, respectively, and the period of the first clock signal is $T_{mclk1}$, and the period of the second clock signal is $T_{mclk2}$, and constant numbers indicating multiples of $T_{mclk1}$ are $L_1$, $L_2$, $L_2$, and $L_4$, and a shortest one of $T_A$, $T_B$ $T_C$ and $T_X$ is $T_1$, and a longest one of $T_A$, $T_B$, $T_C$ and $T_X$ is $T_2$, the following conditional equation is preferably satisfied.

$$T_A = L_1 \cdot T_{mclk1}$$

$$T_B = L_2 \cdot T_{mclk1}$$

$$T_C = L_3 \cdot T_{mclk1}$$

$$T_X = L_4 \cdot T_{mclk1}$$

$$T_y \geq T_2 + T_{mclk2}$$

$$T_z \geq T_2 + T_{mclk2}$$

$$T_{mclk2} \leq T_1$$

When the high-level lengths of time and the low-level lengths of time of the serial data D1, D2 and D3 are set as described above, the differences of the low-level length of time and the high-level length of time between the serial data D1, D2 and D3 can be set greater, so the transmission margin is enlarged and thus erroneous transmission can be suppressed.

According to the present invention, there is provided a digital signal transmitting apparatus of an asynchronous type capable of suppressing erroneous transmission caused by a variation in clock.

DESCRIPTION OF THE PREFERRED EMBODIMENTS

The present invention will be described below with reference to the drawings showing embodiments thereof.

Figures 1, 2:
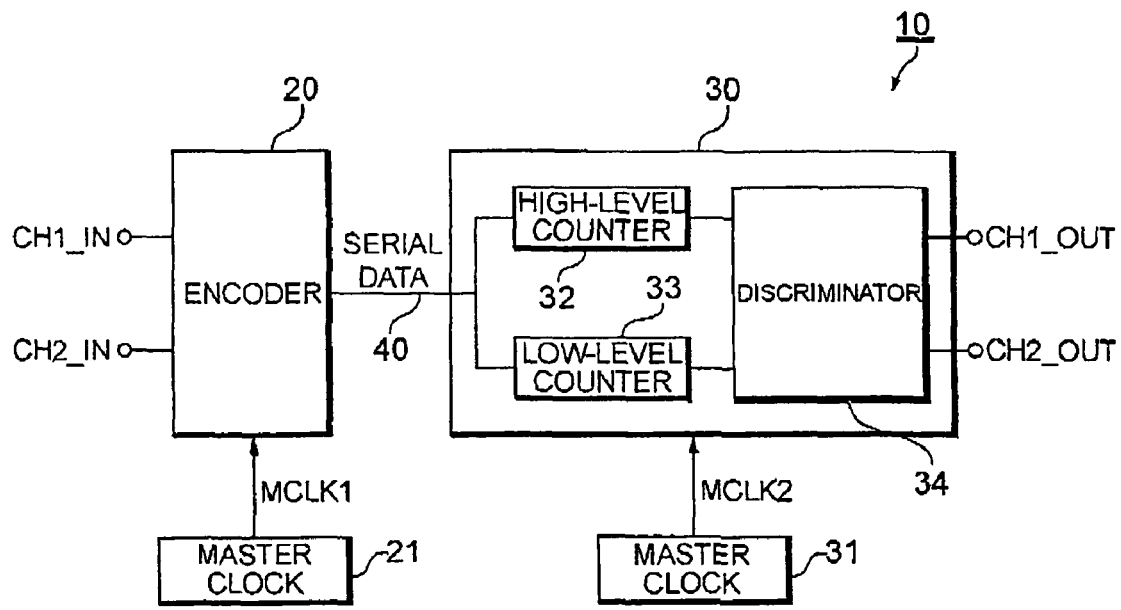
FIG. 1 is a functional block diagram of a digital signal transmitting apparatus according to the present embodiment.
FIG. 2 is an explanatory view showing the relationship between combinations of four kinds of logical values of the parallel output signals of two channels and three kinds of serial data.

FIG. 1 is a functional block diagram of a digital signal transmitting apparatus 10 according to the present embodiment. The digital signal transmitting apparatus 10 includes an encoder 20 which converts parallel input signals (CH1_IN; CH2_IN) of two channels into serial data, a decoder 30 which converts the serial data into parallel output signals (CH1_OUT; CH2_OUT) of two channels, and a transmission line 40 which connects the encoder 20 with the decoder 30 to transmit the serial data. Here, the parallel input signals, the serial data and the parallel output signals are each a digital signal having two logical values (a high level and a low level). Combinations of the logical values of the parallel output signals are identical to combinations of the logical values of the parallel input signals.

The encoder 20 operates in a manner synchronized with a clock signal MCLK1 supplied at a constant frequency from a master clock 21; and the decoder 30 operates in a manner synchronized with a clock signal MCLK2 supplied at a constant frequency from a master clock 31. The master clocks 21 and 31 are each an independent clock generator and operate in a manner asynchronous with each other. The decoder 30 includes: a high-level counter 32 which counts up when the logical value of the serial data is a high level at a point in time when the clock signal MCLK2 rises (or falls); a low-level counter 33 which counts up when the logical value of the serial data is a low level at a point in time when the clock signal MCLK2 rises (or falls); a discriminator 34 which converts the serial data into parallel output signals (CH1_OUT; CH2_OUT) of two channels based on the count results of the high-level counter 32 and low-level counter 33.

A method of converting parallel input signals of two channels into serial data will be described with reference to FIGS. 2 and 3. As illustrated in FIG. 2, the encoder 20 associates three kinds of serial data D1, D2 and D3 with each combination of four kinds of logical values of two-channel parallel input signals. More specifically, the encoder 20 converts the parallel input signals into the serial data D1 when CH1_IN=0 and CH2_IN=0, or converts the parallel input signals into the serial data D2 when CH1_IN=1 and CH2_IN=0, or converts the parallel input signals into the serial data D3 when CH1_IN=0 and CH2_IN=1, or converts the parallel input signals into the serial data D1 when CH1_IN=1 and CH2_IN=1.

Figures 3, 4:
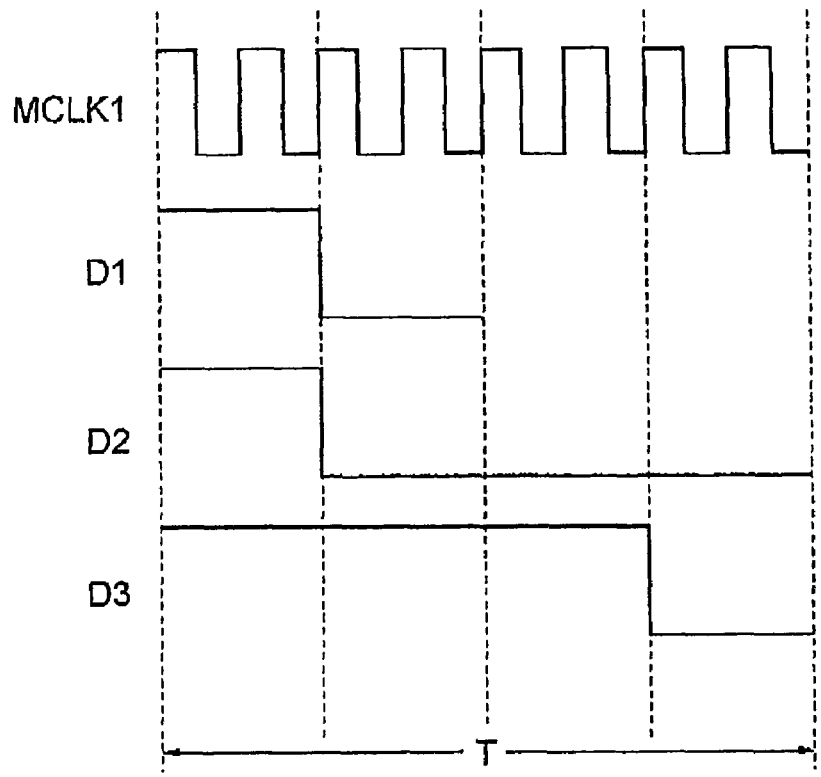
FIG. 3 is an explanatory view of transmit waveforms of the serial data according to the present embodiment.
FIG. 4 is an explanatory view showing a determination condition for converting the serial data into the parallel output signals of two channels.

The serial data D1 is, as illustrated in FIG. 3, a digital signal which has a period of 2T/(N+1) and a ratio (duty factor) of 1:1 with respect to the high-level time and low-level time. The serial data D2 is a digital signal which has a period of T and a ratio of 1:N with respect to the high-level time and low-level time. The serial data D3 is a digital signal which has a period of T and a ratio of N:1 with respect to the high-level time and low-level time. Here, N is a real number greater than 1. As described later, when N is greater than 1, the serial data D1 has a period different from that of the serial data D2 and serial data D3 and further, the time length of one period becomes shorter, so the difference of the high-level time and low-level time between the three serial data can be set greater than when the serial data is produced using the ordinary PWM signal; accordingly, the margin in determination condition can be enlarged. In FIG. 3, for the convenience of explanation, a case is illustrated in which N=3.

In this way, the period of the serial data varies according to the information contained in the serial data. Here, the period of the serial data means a length of time from a rising edge of the serial data to the subsequent rising edge when positive logic is used, or means a length of time from a falling edge of the serial data to the subsequent falling edge when negative logic is used. The encoder 20 reads logical values of the parallel input signals of two channels for each period of the serial data in a manner synchronized with the clock signal MCLK1, and converts the parallel input signals into the serial data.

Referring to the transmit waveforms in FIG. 3, the number of times of the logical values of the serial data D1, D2 and D3 shifting from a high level to a low level in a length of time of one period of the serial data is limited to one (alternatively, the number of times of the logical values of the serial data D1, D2 and D3 shifting from a low level to a high level in a length of time of one period of the serial data may be limited to one).

Here, the relationship between period $T_{mclk1}$ of the clock signal MCLK1 and period T is expressed by the following formula, where L is a real number equal to or greater than 1; in the present embodiment, L is set to 2.

$$T/(1+N) \geq L \cdot T_{mclk1} \qquad (1)$$

The serial data is produced in a manner synchronized with the clock signal MCLK1, so L has a value equal to or greater than 1.

In the present embodiment, the input (CH1_IN=1 and CH2_IN=1) is prohibited; and the operation for this prohibited input set identical to the operation for CH1_IN=0 and CH2_IN=0.

Figure 5:
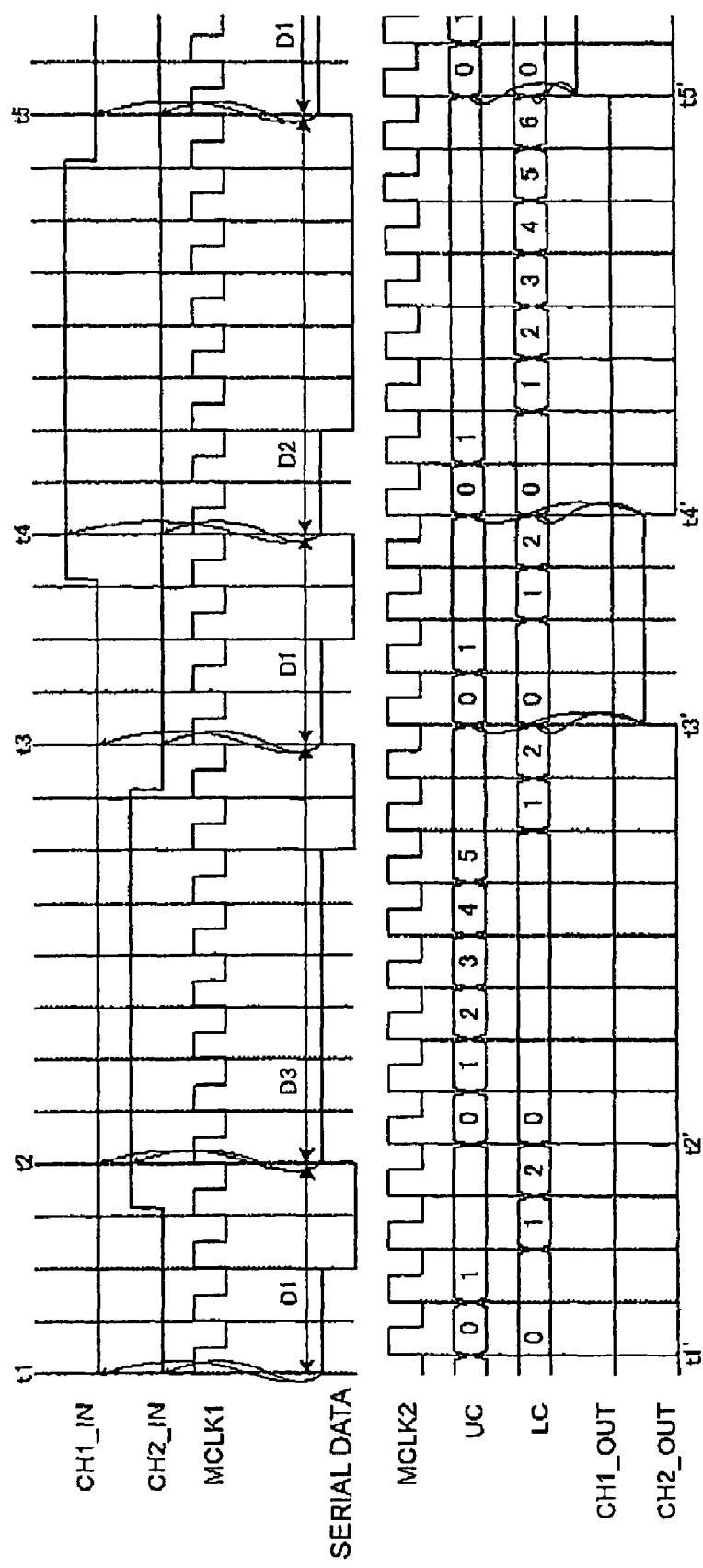
FIG. 5 is a timing chart showing the operation of the digital signal transmitting apparatus according to the present embodiment.

A method of converting serial data into parallel output signals of two channels will be described with reference to FIGS. 4 and 5. The master clocks 21 and 31 operates, as described above, independently of each other, so the clock signals MCLK1 and MCLK2 are not synchronized with each other. Thus, it should be noted that the serial data is not synchronized with the clock signal MCLK2.

The relationship between period $T_{mclk2}$ of the clock signal MCLK2 and period T is expressed by the following formula, where M is a real number equal to or greater than 1; in the present embodiment, M is set to 2.

$$T/(1+N) \geq M \cdot T_{mclk2} \quad (2)$$

The condition in formula (2) that M is a real number equal to or greater than 1 means a condition described later which allows the high-level counter 32 to count at least once in a high-level time and also allows the low-level counter 33 to count at least once in a low-level time. Consequently, although the clock signal MCLK1 is not synchronized with the clock signal MCLK2, since a count operation described later is executed in the decoder 30, signal transmission can be unfailingly performed.

The discriminator 34 converts the serial data into the parallel output signals of two channels based on count number UC counted by the high-level counter 32 in a length of time corresponding to one period of the serial data and count number LC counted by the low-level counter 33 in a length of time corresponding to one period of the serial data. In view of the fact that the number of times of the logical value of the serial data shifting from a high level to a low level or shifting from a low level to a high level is one, and of the fact that period $T_{mclk2}$ of the clock signal MCLK2 is constant, count number UC should be used as information indicating a length of time when the logical value of the serial data is a high level, and count number LC should be used as information indicating a length of time when the logical value of the serial data is a low level. More specifically, the discriminator 34 consults a determination table illustrated in FIG. 4 and converts the serial data into the parallel output signals (CH1_OUT=0, CH2_OUT=0) when count number UC and count number LC are both less than P, or converts the serial data into the parallel output signals (CH1_OUT=0, CH2_OUT=1) when count number UC is equal to or greater than P and count number LC is less than P, or converts the serial data into the parallel output signals (CH1_OUT=1, CH2_OUT=0) when count number UC is less than P and count number LC is equal to or greater than P, or converts the serial data into the parallel output signals (CH1_OUT=0, CH2_OUT=0) when count number UC and count number LC are both equal to or greater than P.

P is a threshold value used in a determination condition for converting the serial data into the parallel output signals of two channels and is an integer which satisfies the following condition.

$$T/(1+N) \cdot T_{mclk1} < P \leq N \cdot T/(1+N) \cdot T_{mclk2} \quad (3)$$

The lower limit value of P indicates a condition that count number UC and count number LC both become less than P when the duty factor of the serial data is 1:1; and the upper limit value of P indicates a condition that count number UC is equal to or greater than P when the duty factor of the serial data is N:1 and count number LC is equal to or greater than P when the duty factor of the serial data is 1:N.

The operation of the encoder 20 and decoder 30 will be described with reference to the timing chart illustrated in FIG. 5. Referring to the timing chart, M is set to 2 and N is set to 3 in formulas (1) to (3). In this case, P is greater than 2 and equal to or less than 6.

The encoder 20 reads the logical values of the parallel input signals of two channels at time t1 when the clock signal MCLK1 rises. At time t1, CH1_IN is 0 and CH2_IN is 0, so the encoder 20 outputs serial data D1 from time t1 to time t2.

The length of time from time t1 to time t2 is equal to the period of serial data D1. Then, at time 2 when the outputting of serial data D1 is finished, the encoder 20 reads the logical values of the parallel input signals of two channels in a manner synchronized with the rising of the clock signal MCLK1. At time t2, CH1_IN is 0 and CH2_IN is 1, so the encoder 20 outputs serial data D3 from time t2 to time t3. The length of time from time t2 to time t3 is equal to the period of serial data D3.

Subsequently, the encoder 20 similarly reads the logical values of the parallel input signals of two channels at time t3, time t4 and time t5, and sequentially outputs serial data D1, D2 and D1 corresponding to each combination of the logical values.

The decoder 30 resets count number UC of the high-level counter 32 and count number LC of the low-level counter 33 to zero at a time T1' when the clock signal MCLK2 first rises after time t1 when serial data D1 starts being outputted. The decoder 30 reads the logical value of the serial data each time the clock signal MCLK2 rises after time t1', and increases count number UC by one when the read logical value is a high level, or increases count number LC by one when the read logical value is a low level. This count-up operation is repeated until time t2' is reached when the clock signal MCLK2 first rises after time 2 when the outputting of serial data D1 is finished. The length of time from time t1' to time t2' is equal to the period of serial data D1. The discriminator 34 reads count number UC (=1) and count number LC (=2) at time t2'. These count numbers UC and LC thus read are both less than P, so the decoder 30 outputs CH1_OUT (=0) and CH2_OUT (=0) from time t2' to time t3'.

Count numbers UC and LC are reset to zero at time t2'. The decoder 30 reads the logical value of the serial data each time the clock signal MCLK2 rises after time t2', and sequentially increases count numbers UC and LC by one according to the read logical values. This count-up operation is repeated until time t3' is reached when the clock signal MCLK2 first rises after time 3 when the outputting of serial data D3 is finished. The length of time from time t2' to time t3' is equal to the period of serial data D3. The discriminator 34 reads count number UC (=5) and count number LC (=2) at time t3'. This count number UC thus read are equal to or greater than P and count number LC is less than P, so the decoder 30 outputs CH1_OUT (=0) and CH2_OUT (=1) from time t3' to time t4'.

Subsequently, the discriminator 34 similarly reads count numbers UC and LC at time t4' and time t5', and converts the serial data into the parallel output signals of two channels based on the determination table illustrated in FIG. 4. In this way, the count numbers of the high-level counter 32 and low-level counter 33 are reset to zero at a point in time when the clock signal MCLK2 first rises after the serial data starts being outputted; thus the number of bits required for counting a high-level length of time or a low-level length of time in a period determined based on a point in time when the clock signal MCLK2 rises, is sufficient for the number of bits required in the high-level counter 32 and low-level counter 33. Consequently, while limiting the number of bits required in the high-level counter 32 and low-level counter 33 to a smaller number, the signal transmission is implemented.

The above description is about an example where the high-level counter 32 which counts up when the logical value of the serial data is a high level and the low-level counter 33 which counts up when the logical value of the serial data is a low level are separately arranged. However, an up-down counter may be arranged within the decoder 30, which counts up when the logical value of the serial data is a high level and which counts down when the logical value of the serial data is a low level; in this base, the count result of the up-down counter may be used for a determination condition for converting the serial data into the parallel output signals of two channels. For example, when a counter is used in which the count value UDC changes to zero upon resetting to zero, the serial data is converted into CH1_OUT (=0) and CH2_OUT (=0) when UDC is equal to zero, or the serial data is converted into CH1_OUT 0) and CH2_OUT (=1) when UDC is greater than zero, or the serial data is converted into CH1_OUT (=1) and CH2_OUT (=0) when UDC is less than zero.

Figure 6:
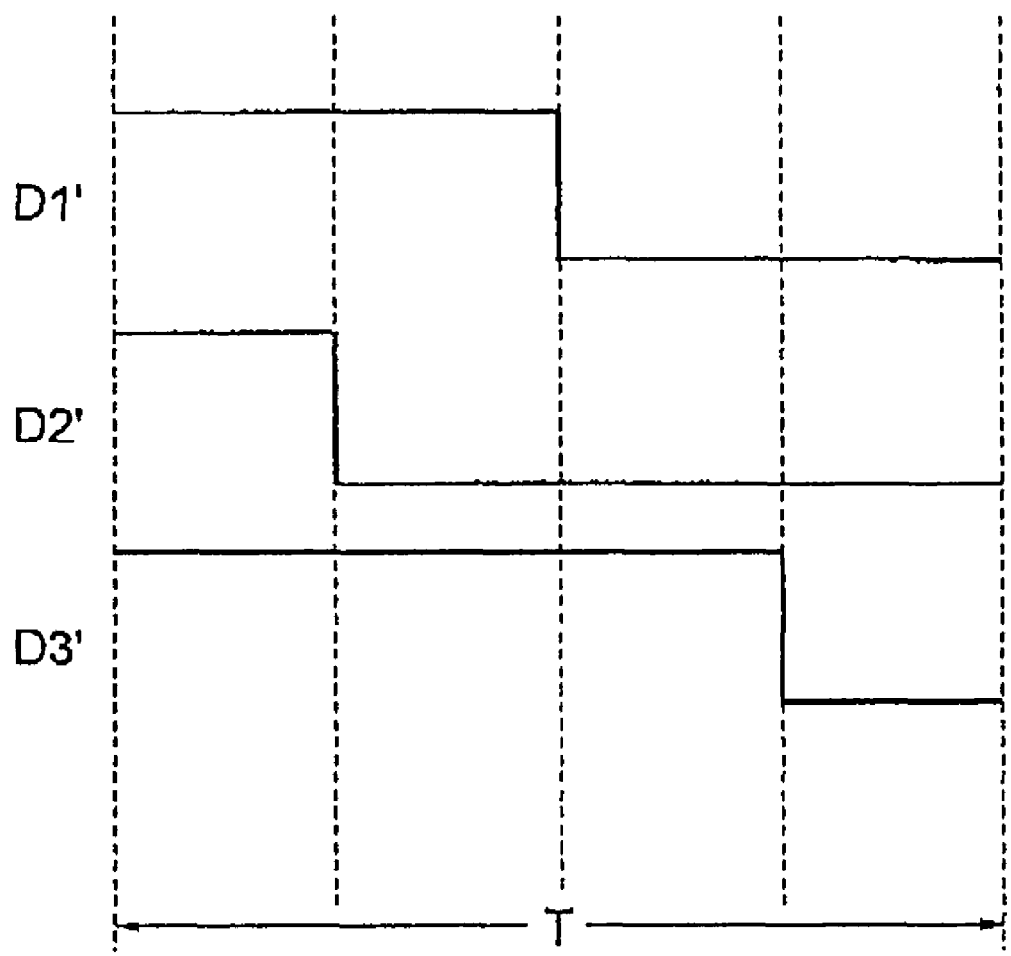
FIG. 6 is an explanatory view of transmit waveforms of the serial data according to a comparative example.

The advantages of the present embodiment will be described. Here, a comparison will be made from a viewpoint of transmission margin between the transmission method according to the present embodiment by which the period of serial data D1 is, the other as illustrated in FIG. 3 descried above, set to 2T/(N+1) and the periods of the other serial data D2 and D3 are set to T, and the transmission method according to a comparative example by which all the periods of serial data D1', D2' and D3' are, as illustrated in FIG. 6, set to T.

First, in order to calculate threshold value P used in the determination condition for converting serial data D1, D2 and D3 illustrated in FIG. 3 into the parallel output signals of two channels, when 2 is assigned to M and 3, to N in formula 2, the following formula is provided.

$$T \geq 8 \cdot T_{mclk2} \quad (4)$$

When formula (3) is assigned to formula (4), P is greater than 2 and equal to or less than 6. Here, P is an integer, so P is 3, 4, 5 or 6.

Now, in order to calculate threshold values P of serial data D1', D2' and D3' illustrated in FIG. 6, when 2 is assigned to M and 3, to N in formula 2, formula (4) is provided.

When all the periods of serial data D1', D2' and D3' are T, the following formula is provided, instead of formula (3).

$$T/2T_{mclk2} < P \leq N \cdot T/(1+N) \cdot T_{mclk2} \quad (5)$$

When formula (4) is assigned to formula (5), P is greater than 4 and equal to or less than 6. Here, P is an integer, so P is 5 or 6.

The transmission method according to the present embodiment has a wider range of threshold value P than the transmission method according to the comparative example and thus has a wider transmission margin. In the digital signal transmitting apparatus 10 according to the present embodiment, the master clock 21 in the modulation side operates in a manner asynchronous with the master clock 31 in the demodulation side, so a variation of period may occur in the clock signal MCLK1 and clock signal MCLK2. When a variation of period occurs in the clock signal MCLK1 and clock signal MCLK2, a variation of the respective count numbers of the high-level counter 32 and low-level counter 33 may occur and thus erroneous data conversion may be made, causing erroneous transmission. Thus, according to the present embodiment, data is, as illustrated in FIG. 3, transmitted using serial data D1, D2 and D3 obtained by combining a different duty factor and a different period, whereby transmission margin is enlarged so that erroneous transmission is suppressed.

The reason why the transmission method according to the present embodiment has a transmission margin greater than the transmission method according to the comparative example can also be understood from the transmit waveforms of the serial data. Referring to the waveforms of the serial data according to the present embodiment illustrated in FIG. 3, the difference of low-level time between serial data D1 and D2 is T/2, and the difference of low-level time and the difference of high-level time between serial data D2 and D3 are both T/2, and the difference of high-level time between serial data D3 and D1 is T/2. In contrast, referring to the waveforms of the serial data according to the comparative example illustrated in FIG. 6, the difference of low-level time and the difference of high-level time between serial data D1' and D2' are both T/4, and the difference of low-level time and the difference of high-level time between serial data D2' and D3' are both T/2, and the difference of high-level time between serial data D3' and D1' is T/4. According to the present embodiment, the difference of low-level time and the difference of high-level time between serial data D1, D2 and D3 can be enlarged, so transmission margin can be enlarged, allowing prevention of erroneous transmission.

Figures 7, 8:
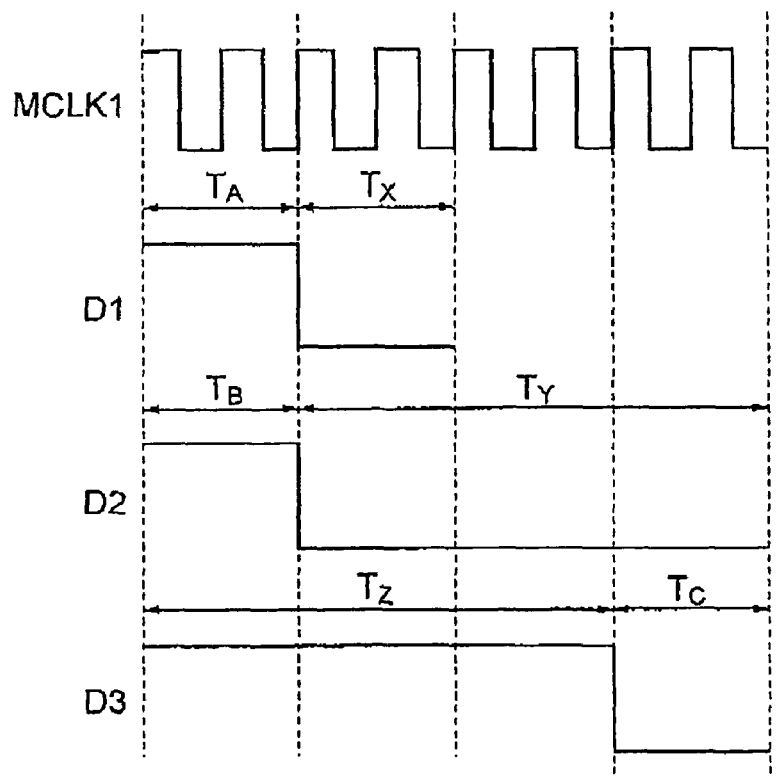
FIG. 7 is an explanatory view showing the relationship between combinations of four kinds of logical values of the parallel output signals of two channels and three kinds of serial data.
FIG. 8 is an explanatory view of transmit waveforms of the serial data according to the present embodiment.

The combination of duty factor and period of serial data D1. D2 and D3 according to the present embodiment is not limited to that illustrated in FIGS. 2 and 3. For example, as illustrated in FIGS. 7 and 8, the encoder 20 may associate three kinds of serial data with each combination of four kinds of logical values of the parallel input signals of two channels. For example, the period of serial data D1 is $(T_A+T_X)$, and the ratio of high-level time $T_A$ to low-level time $T_X$ is A:X; the period of serial data D2 is $(T_B+T_Y)$, and the ratio of high-level time $T_B$ to low-level time $T_Y$ is B:Y; and the period of serial data D3 is $(T_Z+T_C)$, and the ratio of high-level time $T_Z$ to low-level time $T_C$ is Z:C.

The relationship between high-level time, low-level time, period $T_{mclk1}$ of the clock signal MCLK1 and period $T_{mclk2}$ of the clock signal MCLK2 of serial data D1, D2 and D3 illustrated in FIGS. 1 and 8 is expressed by the following formula.

$$T_A = L_1 \cdot T_{mclk1} \quad (6)$$

$$T_B = L_2 \cdot T_{mclk1} \quad (7)$$

$$T_C = L_3 \cdot T_{mclk1} \quad (8)$$

$$T_X = L_4 \cdot T_{mclk1} \quad (9)$$

$$T_y \geq T_2 + T_{mclk2} \quad (10)$$

$$T_z \geq T_2 + T_{mclk2} \quad (11)$$

$$T_{mclk2} \leq T_1 \quad (12)$$

Here, $L_1$ to $L_4$ are all a real number of one or greater; $T_1$ is a shortest period of $T_A$, $T_B$, $T_C$ and $T_X$; $T_2$ is a longest period of $T_A$, $T_B$, $T_C$ and $T_X$. FIG. 8 shows a case where $L_1$ to $L_4$ are all 2, and A, B, C and X are all 1, and Y and Z are both 3. Since the serial data is produced a manner synchronized with the clock signal MCLK1, the condition that $L_1$ to $L_4$ are equal to or greater than 1 means that L has a value of one or greater. The condition that $T_y$ and $T_z$ are both equal to or greater than $T_2+T_{mclk2}$ means a condition allowing the high-level counter 32 to count a value greater than $T_2$ at least once in a high-level time and also allowing the low-level counter 33 to count a value greater than $T_2$ at least once in a low-level time.

The condition of formula (12) that $T_1$ is equal to or greater than $T_{mclk2}$ means a condition allowing a condition allowing the high-level counter 32 to count at least once in a high-level time and also allowing the low-level counter 33 to count at least once in a low-level time. Consequently, although the clock signal MCLK1 is not synchronized with the clock signal MCLK2, since the above described count operation is executed in the decoder 30, signal transmission can be unfailingly performed.

The method, illustrated in FIGS. 7 and 8, of converting the serial data into the parallel input signals of two channels is similar to the method, illustrated in FIGS. 2 and 3, of converting the serial data into the parallel input signals of two channels. Threshold value P used in the determination condition, illustrated in FIGS. 7 and 8, for converting the serial data into the parallel input signals of two channels is an integer which satisfies the following condition.

$$T_2/T_{mclk2} < P \leq T_3/T_{mclk2} \quad (13)$$

The lower limit value of P indicates a condition that, when the duty factor of the serial data is A:X, count numbers UC and LC is less than P. The upper limit value of P indicates a condition that, when the duty factor of the serial data is Z:C, count number UC is equal to or greater than P and when the duty factor of the serial data is B:Y, count number LC is equal to or greater than P.

As will be understood from the above description, when a different period and a different duty factor are combined, the difference of low-level time and high-level time between serial data D1, D2 and D3 can be enlarged, so transmission margin can be enlarged, allowing suppression of erroneous transmission.

The above description is about an example where three kinds of serial data D1, D2 and D3 are converted into the parallel output signals based on count numbers UC and LC corresponding to one period of the serial data. This means that information of three values can be transmitted between the encoder 20 and the decoder 30 by this transmission method. Thus, when serial data D1, D2 and D3 are converted into the parallel output signals based on count numbers UC and LC corresponding to two periods of the serial data, information of $3^2$ (=9) values can be transmitted. Similarly, when serial data D1, D2 and D3 are converted into the parallel output signals based on count numbers UC and LC corresponding to k periods of the serial data, information of $3^K$ values can be transmitted. This method is useful when the number of channels of the parallel input signals and parallel output signals are increased.

The digital signal transmitting apparatus 10 according to the present embodiment has the following advantages.

(1) Serial data D1, D2 and D3 have a different period and a different duty factor corresponding to each combination of the logical values of the parallel input signals of two channels, so even when a variation occurs in the first clock signal MCLK1 or the second clock signal MCKL2, a digital signal transmitting apparatus method with a greater transmission margin can be provided.

(2) When serial data D1, D2 and D3 are converted into line parallel output signals based on count numbers UC and LC corresponding to k periods of the serial data, information of $3^K$ values can be transmitted.

(3) The first clock signal MCLK1 and second clock signal MCKL2 operate in a manner asynchronous with each other, so there is no need for a PLL circuit. Thus, the size of circuit can be reduced; further, since there is no need for a lock time for the PLL circuit at the time of startup, the start-up time can be shortened.

The present application is based on Japanese priority application No. 2008-255051 filed on Sep. 30, 2008 and No. 2009-224998 filed on Sep. 29, 2009, the entire contents of which are hereby incorporated by reference.

What is claimed is:

1. A digital signal transmitting apparatus comprising:
an encoder which converts parallel input signals of a plurality of channels into serial data in a manner synchronized with a first clock signal; and
a decoder which converts the serial data into parallel output signals of the plurality of channels in a manner synchronized with a second clock signal operating in a manner asynchronous with the first clock signal, wherein
the serial data has a different period and a different duty factor corresponding to each combination of the logical values of the parallel input signals of the plurality of channels,
the number of times of the logical value of the serial data shifting from a high level to a low level or shifting from a low level to a high level in a length of time of one period of the serial data is one, and
the decoder includes: a counter which counts whether the logical value of the serial data is a high level or a low level at a point in time when the second clock signal rises or falls; and a discriminator which converts the serial data into the parallel output signals of the plurality of channels based on the count result of the counter corresponding to one period or a plurality of periods of the serial data.

2. The digital signal transmitting apparatus according to claim 1, wherein
after the serial data starts being outputted, the counter resets the number of counts to zero at a point in time when the second clock signal first rises or falls.

3. The digital signal transmitting apparatus according to claim 1, wherein when:
the serial data is expressed as D1, D2 and D3;
the high-level lengths of time of D1, D2 and D3 are $T_A$, $T_B$ and $T_Z$, respectively;
the low-level lengths of time of D1, D2 and D3 are $T_X$, $T_Y$ and $T_C$, respectively;
the period of the first clock signal is $T_{mclk1}$;
the period of the second clock signal is $T_{mclk2}$;
constant numbers indicating multiples of $T_{mclk1}$ are $L_1$, $L_2$, $L_3$, and $L_4$;
a shortest one of $T_A$, $T_B$, $T_C$ and $T_X$ is $T_1$; and
a longest one of $T_A$, $T_B$, $T_C$ and $T_X$ is $T_2$,
the following conditions are satisfied:

$$T_A = L_1 \cdot T_{mclk1}$$

$$T_B = L_2 \cdot T_{mclk1}$$

$$T_C = L_3 \cdot T_{mclk1}$$

$$T_X = L_4 \cdot T_{mclk1}$$

$$T_y \geq T_2 + T_{mclk2}$$

$$T_z \geq T_2 + T_{mclk2}$$

$$T_{mclk2} \leq T_1.$$

4. A digital signal transmitting method comprising:
converting parallel input signals of a plurality of channels into serial data in a manner synchronized with a first clock signal, the serial data having a different period and a different duty factor corresponding to each combination of the logical values of the parallel input signals of the plurality of channels, and the number of times of the logical value of the serial data shifting from a high level to a low level or shifting from a low level to a high level in a length of time of one period of the serial data being one;
counting whether the logical value of the serial data is a high level or a low level at a point in time when the second clock signal operating in a manner asynchronous with the first clock signal rises or falls; and
converting the serial data into the parallel output signals of the plurality of channels based on the count result corresponding to one period or a plurality of periods of the serial data.

* * * * *